United States Patent
Brunner et al.

(10) Patent No.: US 7,863,642 B2
(45) Date of Patent: Jan. 4, 2011

(54) LIGHT EMITTING DIODES AND LASERS DIODES WITH COLOR CONVERTERS

(75) Inventors: Klemens Brunner, Eindhoven (NL); Gunnar Luettgens, Aachen (DE); Benno Spinger, Aachen (DE); Albrecht Kraus, Kerkrade (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 4 days.

(21) Appl. No.: 12/064,097

(22) PCT Filed: Aug. 14, 2006

(86) PCT No.: PCT/IB2006/052797

§ 371 (c)(1),
(2), (4) Date: Feb. 19, 2008

(87) PCT Pub. No.: WO2007/023411

PCT Pub. Date: Mar. 1, 2007

(65) Prior Publication Data

US 2008/0232420 A1      Sep. 25, 2008

(30) Foreign Application Priority Data

Aug. 24, 2005   (EP)   ................... 05107760

(51) Int. Cl.
*H01L 29/207* (2006.01)
*H01L 21/00* (2006.01)
*H01S 5/00* (2006.01)

(52) U.S. Cl. ................. 257/99; 372/50.23; 438/26; 438/27

(58) Field of Classification Search ............ 372/43.01, 372/50.23; 257/99; 438/26–27
See application file for complete search history.

(56) References Cited

U.S. PATENT DOCUMENTS

| | | |
|---|---|---|
| 2003/0111441 A1 | 6/2003 | Jerominek et al. |
| 2003/0141563 A1* | 7/2003 | Wang ............... 257/432 |
| 2003/0160258 A1 | 8/2003 | Oohata |
| 2004/0041159 A1 | 3/2004 | Yuri et al. |
| 2004/0061120 A1 | 4/2004 | Mizuyoshi |
| 2004/0178417 A1 | 9/2004 | Andrews |
| 2004/0227145 A1 | 11/2004 | Abe et al. |
| 2005/0077531 A1 | 4/2005 | Kim |

FOREIGN PATENT DOCUMENTS

| | | |
|---|---|---|
| EP | 0971421 A2 | 1/2000 |
| EP | 1732144 A2 | 12/2006 |
| JP | 63164482 A | 7/1988 |
| JP | 2003258312 A * | 9/2003 |
| JP | 2003258312 A1 | 9/2003 |
| WO | 9210856 A1 | 6/1992 |
| WO | 9704491 A1 | 2/1997 |
| WO | 2005064697 A1 | 7/2005 |
| WO | 2005104252 A2 | 11/2005 |

* cited by examiner

*Primary Examiner*—Tod T Van Roy
*Assistant Examiner*—Patrick Stafford

(57) ABSTRACT

The present invention relates to a light emitting diode (LED) or a laser diode (2) with a functional element (3) mounted on a light out-coupling side of the LED or laser diode (2) wherein the functional element (3) comprises a provision (5) that allows for electrically contacting the LED or laser diode (2) on the light out-coupling side.

12 Claims, 4 Drawing Sheets

LIGHT EMITTING DIODES AND LASERS DIODES WITH COLOR CONVERTERS

Figure 1:
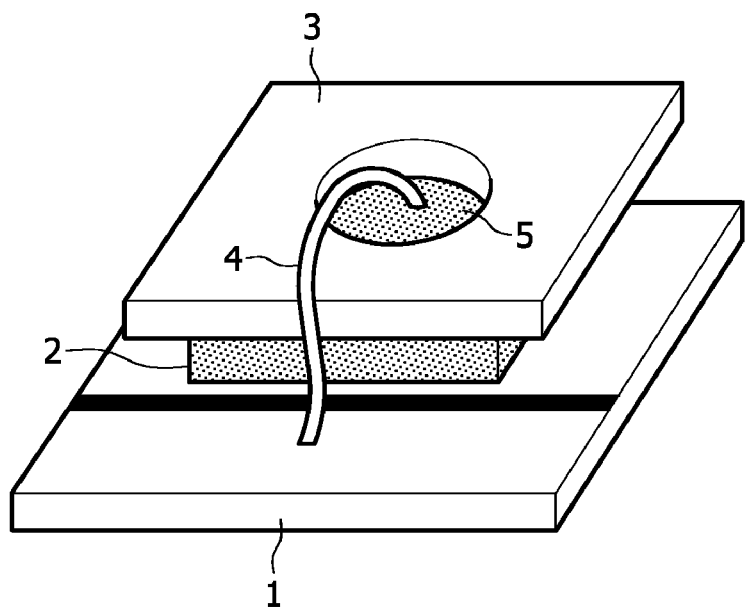

The present invention generally relates to an electrical contacting system for light emitting diodes (LED) and lasers with color converters.

Nowadays, inorganic LEDs have become the most efficient sources of colored light in almost the entire visible spectral range. The combination of LEDs of red, green and blue light color in one package so that the red, green and blue light emission is mixed, resulting in a white light impression is well known.

LEDs are monochromatic light sources. There are several ways to achieve white light emission needed for general lighting applications. As stated above, white light is a mixture of red, green, and blue light (RGB light), which is combined in a package. Such a package can be realized using three types of LED. One type of LED provides the green light, another one the red light, and yet another one the blue light. Typically one would use the gallium nitride GaN material systems to provide the green and blue colors, and the gallium phosphide GaP material system to provide the red color. These semiconductor types are III-V compound semi-conductors. The use of different ligands on gallium leads to different crystallographic structures because of the differing electro-negativity of the ligands. This results in different energy gaps and therefore in different emission wavelengths, and also in different material characteristics, regarding, e.g., temperature and ageing.

The most stable and also very durable semi-conductor is GaN/InGaN. Because of a large band-to-band energy gap it generates a light on the short wavelength side of the visible spectrum showing a very bright, clear, and stable UV, blue or green emission. The mechanical and structural characteristics of GaN/InGaN are also advantageous. A preferred technical solution to generate white light is to use blue light emitting LED pumping a yellow phosphor or a UV emitting LED pumping RGB phosphor. White light is obtaining by mixing the blue and yellow light and the RGB light. Other sets of complementary colors for the LED and the phosphor respectively can also be used to achieve a white color perception.

Because of the microscopic understanding of this light conversion, which is based on photoluminescence, it is also known that the color conversion is not an optical filtering process of the pump wavelength of the LED because the LED itself only produces a monochromatic light, so that filtering methods cannot be applied.

The pump wavelength of the LED semi-conductor induces active energy absorption in the phosphor layer arranged on top of the LED by active photoluminescence. Electrons will be pumped onto defined energy levels from which they can recombine by radiating and non-radiating band relaxation. This causes a defined shift in the light that is emitted by the phosphor to longer wavelengths compared to the pump wavelength of the LED semi-conductor.

A more preferred solution to generate white light or monochromatic light is to use an individual material system such as a blue light emitting LED and to add green and red phosphors or yellow phosphors to generate light of another color. The use of semi-conductor material is not limited to the GaN/InGaN material system. All LED materials systems that can produce blue or UV light emission can be used. If a yellow phosphor is added to the blue LED or if a red AND green phosphor is added to a blue LED or if a blue AND green AND red phosphor is added to an UV LED a white emission is achieved. If an individual phosphor is added, such as for example a green phosphor a monochromatic emission is achieved such as for example green. Such LEDs are disclosed in US 2005/0077531 A1.

The phosphor applied to the LED die is often diluted in an epoxy droplet put on top of the LED, or it forms a layer on top of the LED. However, the phosphor can also be incorporated into transparent or translucent platelets or caps or the phosphor can form a solid-sate body by itself, such as a ceramic platelet or cap. These plates are called color converter plates or caps. The above cups or platelets are preferably used to convert the LED emission, since they are easy to handle and to apply onto the LED, extremely stable in terms of lifetime, photo-degradation and temperature and the thickness of the platelets or caps can be controlled precisely, which results in excellent control of the color point. Other optics such as inorganic lenses can also be placed on top of these cups or platelets.

Such caps or platelets can easily be applied to flip-chip LEDs, in which positive and negative electrical contacts are arranged on one side of the diode where no light emission takes place. Both of these contacts can easily be electrically contacted on contact areas on the substrate or the sub-mount. The ceramic color converter plate can thus be glued on the side opposing the electrical contacts (top of the LED, the side where the light is coupled out) without being obstructed by the electrical contacts.

The problem is that vertical LEDs cannot be used in the system described above, since these vertical LEDs are usually bonded via electrical contacts on opposing sides of the diode: the bottom facing the sub-mount and/or substrate and the top where the light out-coupling from the LED takes place. These electrical contacts, especially on the side where light out-coupling takes place would obstruct the mounting of the caps or platelets. The problem of obstruction of mounting of the platelets or caps obviously extends to all LEDs where at least one electrical contact is placed on the side where the light is coupled out.

It is the objective of the invention, to provide an electrical contacting system and a method for manufacturing an electrical contacting system for LED and laser, so that all bond types of LED or laser can be contacted easily.

This objective is realized in that the electrical contacting system consist of a functional element with a provision in the functional element that allows for electrically contacting the LED or Laser.

This suggests modifying the functional element, e.g. the platelets or caps, in such a manner that the electrical contact can be directly made. It should be clear that the invention pertains to any functional unit that has to be connected to the LED semi-conductor chip and is not limited to color converter platelets or caps. Therefore in the embodiments described below the term color converter plates can always be replaced by other functional elements, which therefore are included in this invention. For example lenses or diffusers can be applied onto LED semi-conductor chips in the same manner. Another aspect is that by solving this problem in such a manner, the color conversion process and efficiency should not be influenced negatively by this kind of contacting. This is realized by various embodiments of the invention.

Advantageous embodiments are described in the dependent claims 2 to 13.

In a first embodiment of the invention, the functional element is a color converter plate.

In another embodiment, the functional element is an optical element such as a lens, beam shaper or diffuser.

A further embodiment the color converter plate is shaped like a cap, which surrounds the light emitting semi-conductor corpus from the top surface to at least one side surface A further embodiment comprises the arrangement of at least one opening in the functional element, e.g. the color converter plate (CCP) or cap, in order to allow at least one electrical contact of the LED to be contacted through the color converter plate or cap. This is a very easy way of installing, e.g. a bond wire. However, this could also be a structural basic feature in order to solder the contact of the bond wire through this opening, as described in the method of manufacturing below.

A further embodiment comprises the arrangement of at least one slit in the functional element, e.g. the color converter plate (CCP) or cap, in order to allow an electrical contact through the color converter plate or cap to be contacted. If the electrical contact is established via wire bonding, a slit is an attractive way of arranging the wire in plane with the CCP by leading the wire via the CCP to the side of the LED. In such an arrangement the side (top), where the light is coupled out from the contacted LED plus CCP is not obstructed by electrical contacts such as bond wires, and other functional elements can be coupled to the LED plus CCP.

The opening and/or the slit, through which the wire can be arranged, can have the additional function that a defined amount of LED pump light is allowed to escape the LED plus CCP unconverted. The LED would thus produce a color, which is a mixture of the wavelength of the LED pump light and the light converted by the CCP. The converted and unconverted part of the LED pump light can be mixed in an optical element arranged above the LED to give, for example, white light. The opening or slit in this embodiment really fulfils a double function.

A further embodiment comprises a cavity in the surface of the color converter plate or cap, which faces the LED semi-conductor chip and/or is glued to the LED semi-conductor chip (=inner surface of CCP). In this cavity an electrical contact such as a bond wire can be arranged from a solder pad on top of the LED semi-conductor chip towards the outside of the LED plus CCP arrangement. This solution is especially interesting for LEDs with bond wires. The bond wires can be arranged very easily in the cavity without inducing a mechanical misfit of the flat converter plate or cap on the flat LED-semi-conductor surface.

A further embodiment comprises a cavity in the functional element, e.g. the color converter plate or cap, as described in the last paragraph, which is adjacent to the solder pad on top of the LED, and extended in such a dimension that it provides space for the soldering of the solder pad in order to allow a close fit between the color converter plate or cap and the LED die.

A further embodiment comprises an electrical contact path, which is embedded in the color converter plate or cap. The LED is contacted via a vertical interconnect from the CCP through part of the color converter plate to the LED electrical contact.

A further embodiment comprises an electrical contact path, which is directly applied on the surface that is not glued to the LED semi-conductor chip (=outer surface of CCP) of the color converter plate or cap, The LED is contacted via a vertical interconnect from the outer surface of the CCP through the color converter plate to the LED electrical contact. This conducting path can easily be placed on the outer surface of the converter plate with conventional thin film application technologies such as vapor phase deposition sputtering and similar.

A further embodiment comprises an electrical contact path, which is applied on the surface facing the LED semi-conductor chip and/or is glued to the LED semi-conductor chip (=inner surface of CCP) of the color converter plate or cap. In such an arrangement no vertical interconnects are needed and the LED is contacted directly to the electrical contact path. The functional element, e.g. color converter plate or cup, can be attached to the LED semi-conductor chip via an electrically conducting attachment such as a conducting glue or paste.

A further embodiment comprises a color converter plate or cap, consisting of several parts. The parts of the CCP can be assembled on the LED semi-conductor chip. The parts may contain any of the above means to provide electrical contact to the semi-conductor chip: electrical contacts on the top surface, bottom surface or embedded in the chip. The parts can also be formed in such a manner that they leave an opening upon assembly or contain a cavity. The LED semiconductor chip can be electrically contacted via such an opening or cavity. The color converter plate or cap can be split into several parts in such a manner that the opening is centered automatically on the electrical top contact of the LED semi-conductor chip by the parts upon assembly.

A further embodiment comprises a color converter plate, which has a pattern of openings or cavities with the electrical contact, e.g. bond wire, arranged through at least one of them. An arrangement of several openings or cavities can play an important role by creating LED arrays.

The invention relates to the arrangement of a bond wire through an opening or a slit or a cavity of the color converter plate according to a method for manufacturing electrical contacting systems for light emitting diodes (LED) with color converter plates, in which wire-bonded LEDs are used. Thus a very easy mass production is possible using wire-bonded LEDs.

A further embodiment of the manufacturing method comprises a combination of one of the above embodiments of color converter plates with embedded electrical contacts or an electrical contact arranged on the outer or inner surface of the CCP, with an opening or slit. The color converter plate can also consist of several parts. The opening or slit is arranged on the LED-semi-conductor die, so that the opening or slit of the color converter plate coincides with an electrical contact such as a solder pad on top of surface of the LED-semi-conductor die.

Electrical contact between the LED semi-conductor chip and the conducting path on/in the CCP can be made through the opening of the color converter plate or cap with the solder pad of the LED-semi-conductor die. For example solders or electrically conducting glues or pastes can be used to make the contact between the LED semi-conductor chip and the CCP. This is an elegant manufacturing method to contact the LEDs in a very durable way with high reproductive performance.

A further advantageous embodiment of the method comprises a bond wire on the top of the LED-semi-conductor die, which is soldered at an angle of incidence of less than 30 degrees. Thus LEDs with a conventional easy contact system can also be used.

If it is possible to solder at an angle of incidence of less than 10 degrees, this is very advantageous in order to realize a close fit between the color converter plate or cap and the LED die.

It is understood that all electrical contacts described in this invention in relation to the CCP can be of any conducting material that can be applied on/in the CCP or functional element and that can support enough current density for the LED semi-conductor chip. For example, metals such as copper, gold or aluminium can be used or transparent conductors such as conducting oxides (e.g. indium tin oxide) or thin transparent metal films or conducting alloys of any kind or organic conductors such as polyaniline or PEDOT:PSS.

These and other aspects of the invention will be apparent from and elucidated with reference to the embodiments described below.

DRAWINGS

FIG. 1: Flip chip LEDs vs. vertical LEDs+color converter plates
FIG. 2: Detailed openings created on/in different color converter types
FIG. 3: Segmented, e.g. split color converter plates
FIG. 4: Outer conducting paths on color converter cap
FIG. 5: Inner conducting paths in color converter cap
FIG. 6: Different arrangements of conducting paths
FIG. 7: Contacting through the opening of the color converter plate
FIG. 8: Soldering below the color converter plate FIG. 1 shows the first embodiment of the invention. The LED-semi-conductor corpus 2, the LED die, is arranged on a sub-mount or a substrate 1. The color converter plate 3, which is a ceramic plate with phosphor incorporated, is arranged on top of this structure. Other opto-active or wavelength-shifting elements are imaginable.

The color converter plates 3 can be glued onto the LED corpus 2, for example with a conducting glue.

This embodiment comprises the arrangement of at least one opening 5 in the functional element, e.g. the color converter plate (CCP) or cap 3, in order to allow at least one electrical contact 8 of the LED to be contacted through the color converter plate or cap 3. This is a very easy way of installing e.g. a bond wire 4. However, this could also be a structural basic feature in order to solder the contact of the bond wire 4 through this opening 5, as described in the manufacturing method below.

So the LED semi-conductor is a wire-bonded version. One electrical contact is on the bottom and not visible. This first contact or wire is contacted on the sub-mount 1. The color converter 3 has a centered opening 5 through which the second, i.e. the visible bond wire 4 is led. The opening 5 can be used simultaneously by leading a stable and defined amount of basic through it, pump-wavelength light that is not color converted by the physical process described above. This first amount of unconverted basic light will be mixed with the converted amount of light coming through the closed cross-area of the color converter plate. A lens body, which is not shown here, is arranged above the color converter plate in order to mix the two light colors to, for example, white light of a defined light temperature.

This inventive structure solves the above problem in a very easy constructive way, which also results in the described double function.

Figure 2:
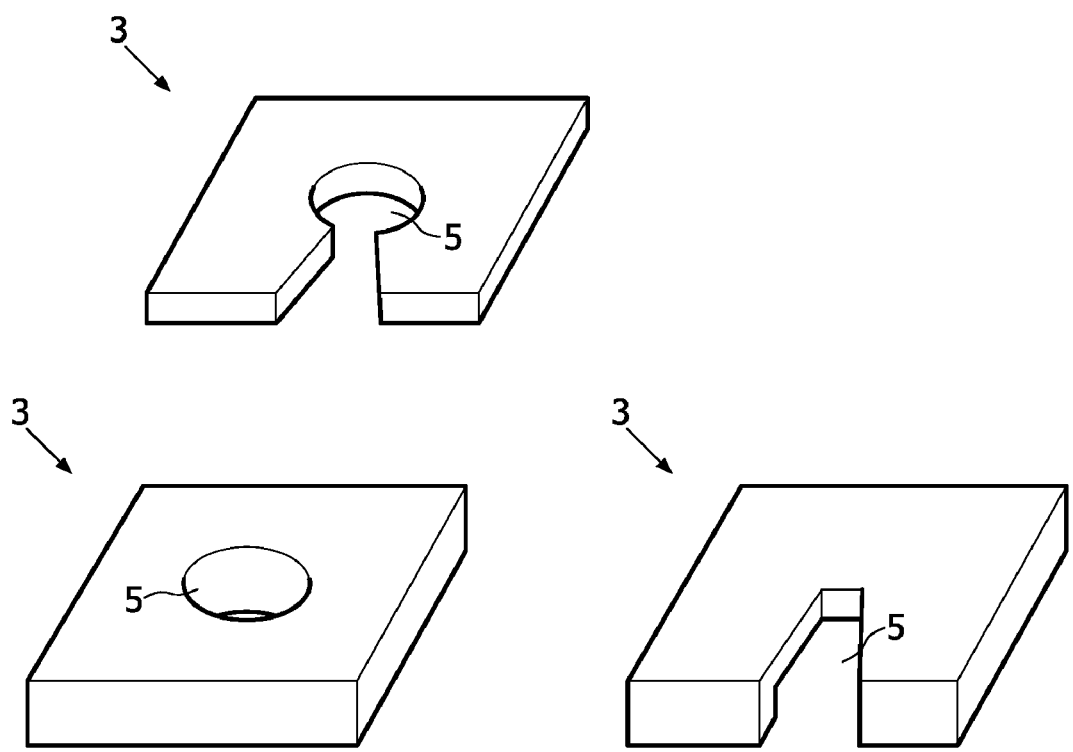

FIG. 2 shows a different embodiment for the special functional design of the color converter plate or cap 3. This embodiment comprises the arrangement of at least one slit as an opening 5 in the functional element, e.g. the color converter plate (CCP) or cap 3, in order to allow an electrical contact through the color converter plate or cap to be contacted. If the electrical contact is established via wire bonding, a slit is an attractive way of arranging the wire in plane with the CCP by leading the wire via the CCP to the side of the LED. In such an arrangement the side (top), where the light is coupled out from the contacted LED plus CCP is not obstructed by electrical contacts, such as bond wires, and other functional elements can be coupled to the LED plus CCP.

The upper part of the drawing of FIG. 2 shows a flat color converter plate with a face-centered opening of a defined cross section. This opening ends in a trapeze slit running from the opening in the center to the side of the color converter plate.

Figure 3:
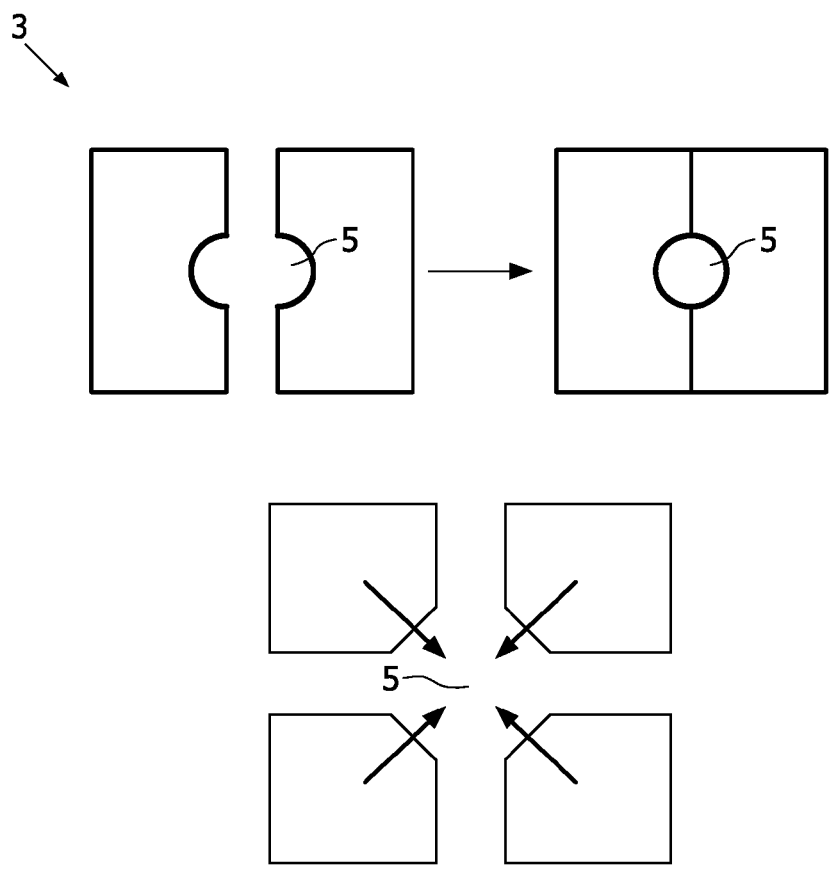

FIG. 3 shows the embodiment in which a split or segmented color converter plate or cap 3 is used. A color converter plate 3 is shown above this, which consists of 2 segments. The two parallel sides of the segments face each other and both have a half-circle area of the circular opening 5, which results from the shifting together of the two segments of the color converter plate that are arranged on top of the LED semi-conductor die. As a consequence, this embodiment also allows an easy mounting procedure with respect to the bond wire that is guided through the resulting circular opening. The wire can also be mounted first, with the platelets applied from different sides afterwards.

The resulting opening can also have another contour, e.g., square, oval or any other form that can be implemented in the ceramic color converter plate or cap.

The lower part of FIG. 3 shows an embodiment in which the color converter plate or cap 3 is divided into 4 segments. This embodiment also features segments having contours resulting, if shifted together, in a central opening 5. The bond wire can also easily be guided through this opening in this version of the embodiment.

Figure 4:
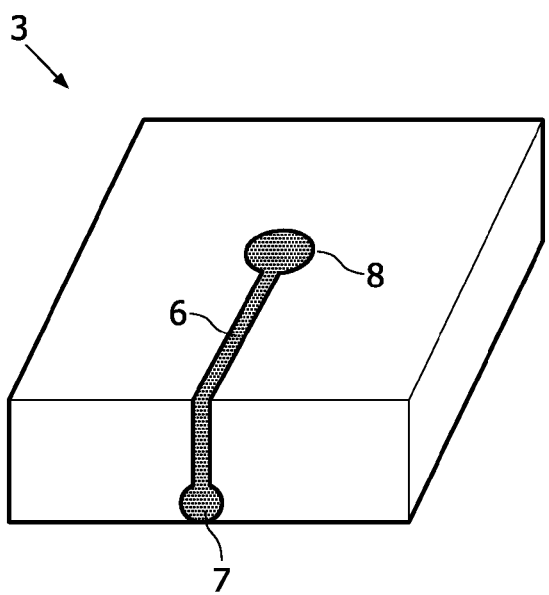

FIG. 4 shows a color converter cap 3. A conducting path 6 is arranged on top of the outer surface that represents the outer surface after the cap is arranged on the LED die, by, for example, vapor phase deposition. This conducting path is arranged between a central contact portion 8, which contacts the semi-conductor die through an opening or an arranged conducting via or post, in order to contact it with the LED die. The conducting path 6 runs to the sideline of the cap 3 where it ends in a solder pad 7. This solder pad 7 is used to connect it to a further bond wire, or to a connecting portion on the sub-mount of the vertical LED structure. The conducting path can also be a copper path etched out of a thin copper layer, by which the color converter plate can previously be covered. The conducting path can be realized by a very thin conductive film, through which the light and/or the converted light from the LED-die can pass.

Figure 5:
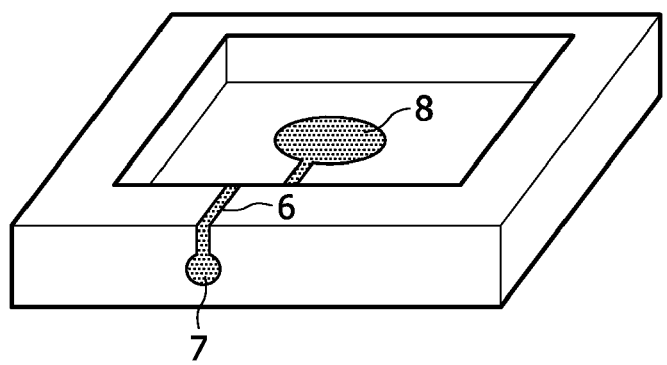

Another alternative embodiment of the color converter plate or cap is shown in FIG. 5. The electrical contact of the LED is realized by a conducting path 6 arranged on the inner side of the cap 3. A solder pad 7, 8 is arranged at each end of the conducting path. One is centered in the middle of the plate or cap in order to contact the LED die. The other one goes outside, in order to be electrically contacted with the sub-mount or electrical means arranged there.

FIG. 6 shows four detailed disclosed embodiments of the arrangements, i.e. in some cases incorporated integral arrangements of the conducting paths.

Figure 6A:
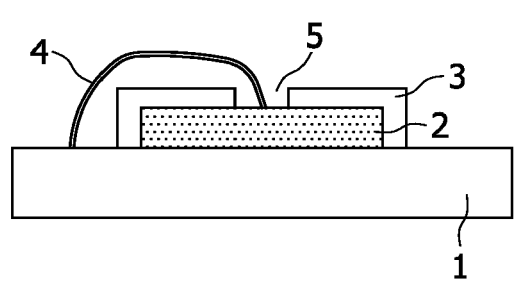

FIG. 6*a* shows a vertical LED structure comprising a cap-like color converter 3, which encloses the complete LED die 2 above the sub-mount or substrate 1. A central opening 5 is arranged to guide a bond wire 4 through it. Furthermore, it allows a definite emission of unconverted pump-wavelength light.

Figure 6B:
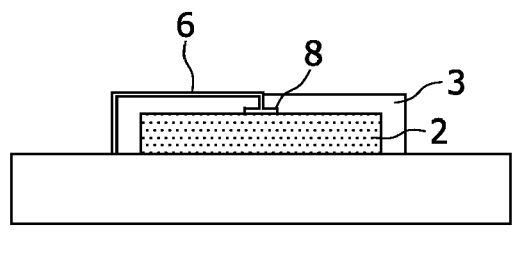

FIG. 6*b* shows the same structure as in FIG. 6*a* but without a defined opening in the colour converter cap 3. In this embodiment, the conducting path 6 is arranged on the outer surface of the cap 3, but still closely on top of the surface, and not as a wire, as can be seen in FIG. 6*a*. A kind of conducting post or via is arranged centred only on the face surface of the cap, which leads through the cap up to an inner solder pad 8 or contact pad which is electrically contacted to the LED die 2.

Figure 6C:
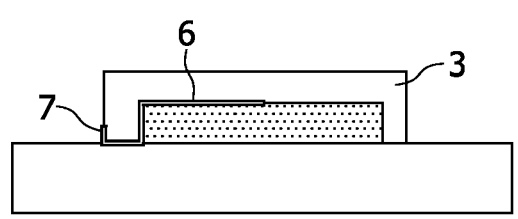

FIG. 6c shows a side view of the detailed cap-like structure in FIG. 5. The conducting path 6 is arranged mainly inside the inner surface of the cap 3. The conducting path 6 is arranged around the side and ends close to the outer side on a solder pad 7 only at the side of the cap, to be contacted there with a soldered wire or directly with the contacting means on the sub-mount.

Figure 6D:
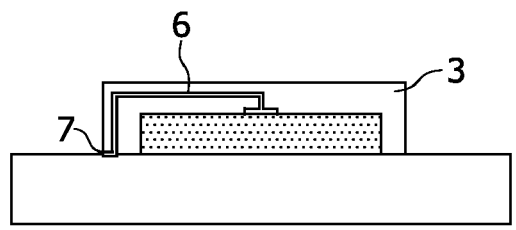

FIG. 6d shows a special embodiment, by which the conducting path 6 is incorporated into, e.g. integrally inside the bulk of the colour converter cap 3. This conducting part can be e.g. a piece of wire. The colour converter can also be a simple plate in this special embodiment as well as in the other embodiments shown in FIG. 6. The arrangement of the conducting means is similar. It is parallel to the example shown in FIG. 6c, but it is arranged in the bulk, i.e. inside the cap or plate bulk. The ends of the conducting paths are created as solder or contact pads as in FIG. 6c.

The embodiments of FIGS. 6b to 6d show no opening, which in FIG. 6a could be simultaneously used for defined unconverted pump-wavelength light emission. The colour converter plate or cap only consists of a medium concentration of phosphor or other opto-active material in the embodiments of FIGS. 6b to 6d. Thus, the opto-active wavelength shift of the colour conversion process is clearly less than 100% efficient. As a result, both an amount of converted and unconverted light is emitted. The total, is therefore almost 100%.

Figure 7:
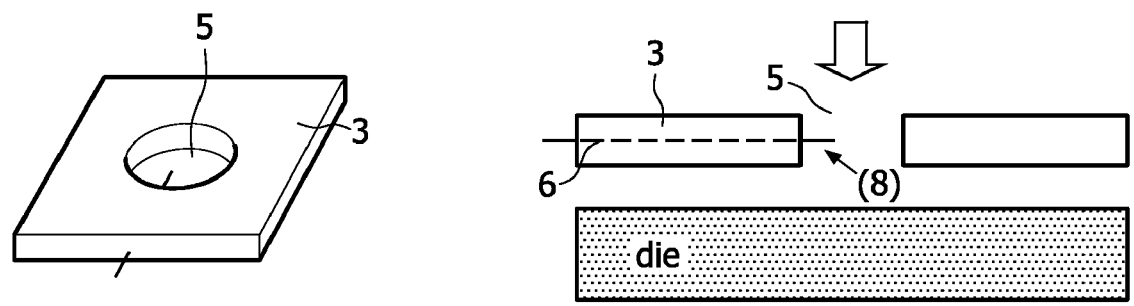

FIG. 7 shows a not finally mounted LED in more details, so that the steps described and claimed by the method of manufacturing can be shown. A colour converter 3 with integral incorporated conducting paths 6 is arranged on top of the LED die surface, the conducting path 6 ends in the opening 5 of the colour converter plate 3 by clearly entering inside it. If the converter plate 3 is positioned on top of the LED die surface, a soldering or welding step is done through this opening 5 to create an electrical connection between the conducting path end and the contact region on top of the LED-die. The opening may then be closed, and therefore the embodiment created by this method uses a colour converter material as used in the embodiments of FIGS. 6a to 6d.

Figure 8:
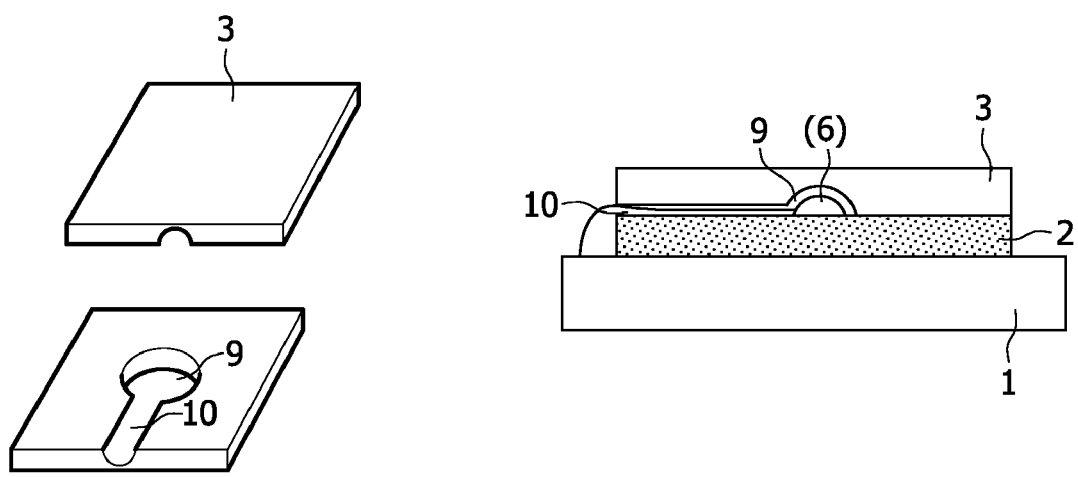

A further embodiment, which also comprises a different method of mounting, the vertical LED structure, is shown in FIG. 8. The functional element, in this case the colour converter 3, comprises a cavity 9 in the surface of the color converter plate or cap 3, which faces the LED semi-conductor chip and/or is glued to the LED semi-conductor chip (=inner surface of CCP). An electrical contact such as a bond wire can be arranged in this cavity 9 from a solder pad 6 on top of the LED semi-conductor chip towards the outside of the LED plus CCP arrangement. This solution is especially interesting for LEDs with bond wires. The bond wires can be arranged very easily in the cavity 9 without inducing a mechanical misfit of the flat converter plate or cap on the flat LED-semi-conductor surface.

The contact region of the LED die is soldered with a structure of nearly half a drop. During of this procedure, the bond wire is soldered at a very small angle of incidence. In some cases an angle of less than 30 degrees is acceptable, but an angle of less than 10 degrees is very advantageous. Thus the cavity 9 is as flat as possible while fitting the LED die as closely as possible. A further cavity or groove 10, also line-shaped, guides the bond wire to the side and from there out of the structure, so that it can be bonded to the sub-mount 1 externally.

This embodiment also comprises a closed colour converter plate or cap 3 without an opening for a partial pump-wavelength light emission.

The invention claimed is:

1. A light source which is electrically accessible after combining with a lens, the light source comprising:
   a) a light emitting die in the form of a light emitting diode (LED) chip having a light out-coupling side with a contact pad;
   b) a functional element mounted with an inner surface on said light out-coupling side and comprising a provision for electrically contacting the contact pad, said provision being selected from the group consisting of:
      a slit-shaped opening extending from a point substantially centrally located over said light out-coupling side to an outer edge of said functional element, and
      an opening formed at a point substantially centrally located over said light out-coupling side between at least two parts of the functional element joined together over said light out-coupling side forming said provision due to a mating open area in said functional element when said at least two parts are joined together, wherein a first amount of unconverted light from said light out-coupling is mixed with a second amount of converted light coming through said functional element; and
   c) a contact wire running through the provision of the functional element and connected to the contact pad;
      wherein said provision for electrically contacting the contact pad of said light emitting die is accessible by exposure of said contact pad of said light emitting die through said functional element after combinational mounting of said functional element to said light emitting die on said light out-coupling side.

2. Light source according to claim 1, wherein the functional element is a color converter plate or an optical element selected from the group consisting of: a lens, beam shaper and diffuser.

3. Light source according to claim 1, wherein the functional element is shaped like a cap, which surrounds the light emitting die from the light out-coupling side to at least one side surface.

4. Light source according to claim 1, wherein the functional element is split into several non-contiguous parts prior to assembly over said light emitting die.

5. A method for manufacturing a light source which is electrically accessible after combination of said light source with a provision, comprising:
   a) contacting with a contact wire a contact pad on a light out-coupling side of a light emitting die which has the form of a light emitting diode (LED) chip or a laser chip, and then
   b) mounting on said light out-coupling side a functional element which comprises includes a provision for electrically contacting the contact pad,
      said provision being selected from the group consisting of a slit-shaped opening extending from a substantially central position in said functional element to an edge of said functional element, an opening formed between at least two parts of the functional element when said at least two parts are brought together thereby forming said opening over said light out-coupling side of said functional element, said provision providing access to said contact wire on said contact pad on said light out-coupling side of said light emitting die after mounting said functional element on said light out-coupling side so that said contact wire and contact pad may be reconnected if said connection is broken;

wherein said provision allows said light source to mix both unconverted light emitted through said provision with converted light emitted through said functional element.

6. Method according to claim 5, wherein the contact wire is a bond wire and the bond wire is soldered at an angle of incidence of less than 30 degrees on the light out-coupling side.

7. Method according to claim 5, wherein the contact wire is a bond wire and the bond wire is soldered at an angle of incidence of less than 10 degrees on the light out-coupling side.

8. The method of claim 5, wherein the provision includes an opening formed between at least two parts of the functional element.

9. The method of claim 1, wherein the provision includes a slit-shaped opening.

10. The method of claim 1, wherein the provision includes an opening formed between at least two parts of the functional element.

11. The method of claim 1, wherein the provision includes a cavity in the inner surface of the functional element connecting the contact pad to the outside of the functional element.

12. A light source and color converter plate, comprising:

a light emitting die in the form of an LED or a laser emitter having a light out-coupling side with an electrical contact pad;

a color converter plate positioned over said light emitting die and allowing said electrical contact pad to be accessible through said color converter plate through an opening formed in said color converter plate, said opening positioned substantially over said color light out-coupling side of said light emitting die and said electrical contact pad;

wherein said color converter plate has either
  a slot extending from said opening extending from said opening to an edge of said color converter plate, or
  wherein said color converter plate is a segmented separated multi-piece color converter plate having a mating parallel sides facing each other, said opening formed partially by at least first and second joined segmented separated multi-piece color converter segments;

a contact wire extending from said electrical contact pad on said light emitting die through said opening of said color converter plate;

wherein said color converter plate provides access to access to said electrical contact pad of said light emitting die and said contact pad so that said contact wire and contact pad may be reconnected through either said slot or said opening of said color converter plate;

wherein said positioning of said color converter plate over said light emitting die causes a first amount of unconverted light to be mixed with a second amount of converted light emitted through said color converter plate.

* * * * *